United States Patent [19]

Bohnert

[11] Patent Number: 5,343,036

[45] Date of Patent: Aug. 30, 1994

[54] OPTICAL MEASUREMENT OF ELECTRICAL QUANTITIES USING INVERSE PIEZOELECTRIC EFFECT WITH DUAL DOUBLE-MODE FIBER

[75] Inventor: Klaus Bohnert, Niederrohrdorf, Switzerland

[73] Assignee: Asea Brown Boveri Ltd., Baden, Switzerland

[21] Appl. No.: 44,478

[22] Filed: Apr. 9, 1993

[30] Foreign Application Priority Data

May 15, 1992 [DE] Fed. Rep. of Germany ....... 4216152

[51] Int. Cl.$^5$ .............................................. H01J 5/16
[52] U.S. Cl. ......................... 250/227.19; 250/227.21; 324/96
[58] Field of Search ...................... 250/227.21, 227.17, 250/227.19, 227.14; 324/96, 244.1, 72, 458; 385/1, 2, 12, 13, 14, 33, 35

[56] References Cited

U.S. PATENT DOCUMENTS

| | | |
|---|---|---|
| 4,319,186 | 3/1982 | Kingsley . |
| 4,477,723 | 10/1984 | Carome et al. . |
| 4,524,322 | 6/1985 | Bobb . |
| 4,642,458 | 2/1987 | Jackson et al. ............... 250/227.17 |
| 4,929,830 | 5/1990 | Bohnert et al. . |
| 5,053,693 | 10/1991 | Bohnert et al. . |
| 5,196,695 | 3/1993 | Bohnert et al. ............... 250/227.17 |
| 5,204,619 | 4/1993 | Beigbeder et al. ........... 250/227.17 |

FOREIGN PATENT DOCUMENTS

| | | |
|---|---|---|
| 0316619 | 5/1989 | European Pat. Off. . |
| 0316635 | 5/1989 | European Pat. Off. . |
| 0433824A1 | 6/1991 | European Pat. Off. . |
| 2945019 | 5/1980 | Fed. Rep. of Germany . |
| 2856183 | 7/1980 | Fed. Rep. of Germany . |
| 4025911A1 | 4/1991 | Fed. Rep. of Germany . |
| 4114253A1 | 11/1992 | Fed. Rep. of Germany . |
| 4115370A1 | 11/1992 | Fed. Rep. of Germany . |

OTHER PUBLICATIONS

"Use of highly elliptical core fibers for two-mode fiber devices", Kim, et al., Optics Letters, Sep. 1987, vol. 12, No. 9, pp. 729–731.

"Elimination of drift in a single-mode optical fiber interferometer using a piezoelectrically stretched coiled fiber", Jackson, et al., Applied Optics, Sep. 1980, vol. 19, No. 17, pp. 2926–2929.

"Passive Quadrature Phase Detector for Coherent Fiber Optic Systems", Huang, et al., Springer Proceedings in Physics, vol. 44, 1989, pp. 38–43.

(List continued on next page.)

Primary Examiner—David C. Nelms
Assistant Examiner—Que T. Le
Attorney, Agent, or Firm—Burns, Doane, Swecker & Mathis

[57] ABSTRACT

In a fiber-optic sensor for measuring electric fields and voltages, in place of a double-mode fiber extending between sensor head (15) and evaluating unit (14) two separate, similar double-mode fibers (5a, 5b) are connected in series in the manner of a tandem interferometer. The first double-mode fiber (5a), serving as sensor fiber, is operated in reflection geometry. Together with the sensor element (6), it is disposed in the sensor head (15). The second double-mode fiber (5b), serving as reference fiber, is situated within the separate evaluating unit (14). Within the latter there is also provided at least one fiber coupler or beam splitter, which is required on account of the operation of the sensor fiber in reflection geometry. Sensor head (15) and evaluating unit (14) are connected by a single insensitive monomode fiber.

21 Claims, 10 Drawing Sheets

OTHER PUBLICATIONS

"Homodyne Demodulation Scheme for Fiber Optic Sensors Using Phase Generated Carrier", IEEE Journal of Quantum Electronics, vol. QE-18, No. 10, Oct. 1982, pp. 1647-1653.

"Passive Demodulation of Optical Interferometric Sensors", Green, et al., IEEE Journal of Quantum Electronics, vol. QE-18, No. 10, Oct. 1982, pp. 1639-1645.

"Synthetic-Heterodyne Interferometric Demodulator", Cole, et al., IEEE Journal of Quantum Electronics, vol. AE-18, No. 4, Apr. 1982, pp. 694-697.

"Coherence tuned fiber optic sensing system, with self-initialization, based on a multimode laser diode", Gerges, et al., Applied Optics, vol. 29, No. 30, Oct. 1990, pp. 4473-4480.

"Nondeterministic Endless Control System for Active Polarization Control", Pikaar, et al., Journal of Lightwave Technology, vol. 7, No. 12, Dec. 1989, pp. 1982-1987.

"Fiber-optic sensing of electric field components", Bohnert, et al., Applied Optics, vol. 27, No. 23, Dec. 1988, pp. 4814-4818.

"Fiber-optic sensing of voltages by line integration of the electric field", Bohnert, et al., Optics Letters reprint, from vol. 14, No. 5, Mar. 1989, pp. 290-292.

OPTICAL MEASUREMENT OF ELECTRICAL QUANTITIES USING INVERSE PIEZOELECTRIC EFFECT WITH DUAL DOUBLE-MODE FIBER

BACKGROUND OF THE INVENTION

1. Field of the Invention

The invention relates to the field of the optical measurement of electrical quantities. It concerns a fiber-optic sensor, comprising (a) a light source;

(b) a piezoelectric sensor element;

(c) a first double-mode fiber having an input end and another end, in which fiber the $LP_{01}$ fundamental mode and the even $LP_{11}$ mode can propagate, and which fiber is fixed at least partially to the sensor element in such a manner that a dimensional alteration of the sensor element in an electric field leads to a length alteration in the fiber; and (d) means for measuring the field-dependent length alteration of the fiber;

Such a fiber-optic sensor is known, for example, from EP-A1-0,433,824.

2. Discussion of Background

Fiber-optic sensors for the measurement of electric fields and voltages have already been described in various publications such as, for example, the European Patent Applications EP-A1-0,316,619 and EP-A1-0,316,635 or the articles by K. Bohnert and J. Nehring in Appl. Opt. 27, pp. 4814–4818 (1988), or Opt. Lett. 14, pp. 290–292 (1989).

The measurement principle employed in this case is based on the inverse piezoelectric effect in materials with selected crystal symmetry. The temporally periodic dimensional alteration which is experienced by an appropriate piezoelectric body in an alternating electric field is transmitted to a glass fiber fixed to the body. The length alteration of the fiber is then proportional to the field or voltage amplitude and is measured by interferometry and evaluated.

It is possible to use various types of glass fiber interferometers for the interferometric measurement. On account of its simplicity, of these types the double-mode fiber interferometer known from the article by B. Y. Kim et al., Opt. Lett. 12, pp. 729–731 (1987) is of particular interest. In this interferometer, the parameters of the sensor fiber are selected so that precisely two modes (the $LP_{01}$ fundamental mode and the even $LP_{11}$ mode) can propagate in the fiber.

In the double-mode fiber interferometer, light from a coherent light source, e.g. a laser diode, is passed through a double-mode fiber, which is fixed to a piezoelectric sensor element for the electric field E. The two modes are excited by the light and propagate differently in the fiber. At the fiber end, it is then possible to observe an interference pattern, which arises from the superposition of these two modes. In this case, a length alteration of the fiber leads to a differential phase shift between the two modes, which is expressed in a corresponding alteration of the interference pattern.

The interference pattern exhibits two mutually adjacent substructures, which are detected by two detectors (e.g. in the form of photodiodes). At their output, there are two signals $V_{11}$ and $V_{12}$ which are phase-shifted by 180°:

$$V_{11} = (\tfrac{1}{2})V_0(1 + a^*\cos \phi(t)) \qquad (1)$$

$$V_{12} = (\tfrac{1}{2})V_0(1 - a^*\cos \phi(t)) \qquad (2)$$

where $\phi(t) = A^*\sin \omega t \theta(t)$. The phase shift $\phi(t)$ between the two modes is thus composed of a temporally periodic component $A^*\sin \omega t$ caused by the alternating field to be measured (in this case, A is proportional to the amplitude of the field) and an arbitrary phase term $\theta(t)$, which can likewise alter with time, for example in consequence of temperature-dependent fluctuations of the fiber length. Finally, $V_0$ is proportional to the optical power and a is a measure of the interference contrast.

The sought term $A^*\sin \omega t$ is frequently obtained using a homodyne detection method with active phase compensation from the output signals of the detectors (for a fiber-optic sensor with a-single-mode fiber, see in this connection: D. A. Jackson et al., Appl. Opt. 19, pp. 2926–2929 (1980); a corresponding fiber-optic sensor with a double-mode fiber is described in the initially cited European Application EP-A-0,433,824). In this method, the sensor fiber is additionally guided via a piezoelectric modulator. By means of this modulator 4, the phase shift $\phi(t)$ is regulated to $+(pi/2)$ or $-(pi/2)$ (modulo 2pi). To this end, the modulator is a component part of a control circuit which comprises the detectors, a subtractor and a quadrature regulator and which regulates the difference voltage $$V = V_{11} - V_{12} = V_0 * a^* \cos \phi(t) \qquad (3)$$

to zero in each instance.

The two components $A^*\sin \omega t$ and $\theta(t)$ of the phase shift are both balanced by the modulator via a corresponding (opposite) length alteration of the fiber in- a direct manner. The voltage present at the modulator includes a slowly varying component, which is proportional to $\theta(t)$, and a periodic component, which is proportional to $A^*\sin \omega t$. The sought component $A^*\sin \omega t$ is filtered out via a high-pass filter and can be picked off at the signal output. The output signal is, as a result of this, independent of any possible fluctuations of the laser intensity (i.e. $V_0$) and of the interference contrast a.

On the other hand, the sought term $A^*\sin \omega t$ can also be obtained by means of a homodyne method in which a carrier phase modulation is generated, or by means of a synthetic heterodyne method (in this connection, see: A. Dandridge et al., IEEE J. of Quantum Electronics QE-18, 1647 (1982); J. H. Cole et al., IEEE J. of Quantum Electronics QE-18, 694 (1982); E. L. Green et al., IEEE J. of Quantum Electronics QE-18, 1639 (1982)). In these methods, a modulator is likewise provided. The latter is driven by an oscillator; in this case, the oscillator signal is also passed to a demodulating electronic system. In both methods, it is sufficient to evaluate only one of the two aforementioned interference patterns. They differ only by the nature of the required demodulating electronic system.

In a series of practical applications of the sensor (e.g. in voltage measurement in outdoor installations), relatively large spacings may occur between the actual sensor head and the sensor electronic system (10 m to a few 100 m). It is inexpedient to bridge these spacings with the double-mode fiber itself, since the influence of external disturbances (temperature fluctuations, mechanical vibrations, etc.) is correspondingly enlarged with increasing fiber length and the signal/noise ratio is impaired. The light supply from the laser diode to the interferometer and the return of the output signals of the interferometer should rather take place via separate glass fibers, which are not a component part of the interferometer.

In the above-described homodyne method using an active phase modulator, it would, however, in addition to the connecting glass fibers, also be necessary as well to provide an electrical connection between the sensor electronic system and the sensor head to drive the modulator. The attractiveness of a sensor operating with this type of interferometer would thus be very limited.

Accordingly, it was proposed in two older German Patent Applications (file references P 41 14 253.5 and P 41 15 370.7) to provide, in place of the known active signal detection, which requires an additional modulator in the measurement fiber with a corresponding electrical supply, a passive signal detection which is based on the Guoy effect (in this connection, see: S. Y. Huang et al., Springer Proc. in Physics, Vol. 44 "Optical Fiber Sensors", pp. 38–43, Springer Verlag Berlin, Heidelberg (1989)), i.e. the phase difference between the interference patterns of the close and remote field: the substructures of the close and remote field (4 in total) are in this case separated in the sensor head by optical means, and can be transmitted via separate glass fibers to a remote electronic evaluation system. There, using at least three of these four substructures, the desired information can be obtained via the length alteration of the measurement fiber. Using this proposed solution, a complete electrical separation is indeed achieved between the sensor head and evaluating electronic system. However, this advantage is acquired at the expense of a relatively complex optical system and electronic system. Over and above this, it is necessary to use a monomode laser diode, which demands particular measures for the suppression of the light back-scatter from the sensor into the diode.

SUMMARY OF THE INVENTION

Accordingly, one object of the invention is to provide a novel fiber-optic sensor which on the one hand makes possible a separation, which is insensitive to disturbances, of sensor head and evaluating electronic system, but on the other hand is also distinguished by simple construction and high accuracy of measurement.

In the case of a sensor of the initially mentioned type, this object is achieved in that (e) the light source is a multimode laser diode;

(f) the measuring means comprise a second double-mode fiber;

(g) the parameters of the two double-mode fibers and thus the relative path differences (Delta $L_1$, Delta $L_2$), which the modes accumulate in the individual double-mode fibers, are tuned to the coherence properties of the light source so that the interference contrast (V) for the said path differences (Delta $L_1$, Delta $L_2$) and for the sum of these path differences (Delta $L_1$ + Delta $L_2$) is in each instance approximately equal to zero and for the difference of the said path differences (Delta $L_1$ − Delta $L_2$) adopts an absolute or relative maximum;

(h) the other end of the first double-mode fiber is mirrored;

(i) for the transmission of light between the light source and the measuring means on the one hand and the input end of the first double-mode fiber on the other hand, a monomode fiber is provided; and (j) a fiber coupler or beam splitter is provided for the coupling-in of light from the light source into the monomode fiber and for the coupling-out of light reflected at the other end of the first double-mode fiber out of the monomode fiber into the second double-mode fiber.

According to the invention, use is accordingly made, inter alia, of the principle of white light interferometry for the measurement: light from a multi-mode laser diode is passed via a fiber coupler or beach splitter as well as via an insensitive monomode fiber to a first double-mode fiber (sensor fiber). The coupling at the input end of the first double-mode fiber takes place in such a manner that the two modes which can propagate (the $LP_{01}$ fundamental mode and the even $LP_{11}$ mode) are excited, preferably with equal intensity. This is achieved by an appropriately selected transverse displacement between the optical axes of the fibers. As the other end of the first double-mode fiber is mirrored, the modes propagating from the input end are reflected there and pass back to the input end again, where they are coupled, in approximately equal proportions, into the monomode fiber and are transmitted back via the latter to the fiber coupler or the beam splitter. In the first double-mode fiber, the two modes experience an optical path difference Delta $L_1$, for which the interference contrast is negligibly small. Accordingly, no interference effects occur at the input end of the first double-mode fiber between the two reflected modes.

By means of the fiber coupler or of the beam splitter, a part of the reflected light or of the aforementioned two modes is coupled into a second double-mode fiber. The latter serves as reference fiber and preferably exhibits the same fiber parameters as the first double-mode fiber. The reference fiber can be operated in a transmission configuration or, just like the sensor fiber, in a reflection configuration. In the first case, it must be twice as long as in the second case.

On the other hand, the coupling into the reference fiber takes place in such a manner that the two modes are excited with approximately equal strength. Light which has propagated in the first double-mode fiber in the fundamental mode $LP_{01}$ propagates in approximately equal proportions in the $LP_{01}$ mode and in the even $LP_{11}$ mode in the second double-mode fiber. The same applies to light which has propagated in the first double-mode fiber in the $LP_{11}$ mode.

Where the sensor fiber and the reference fiber are of substantially identical construction with regard to their fiber parameters and in this case especially with regard to their effective length, path differences of zero, Delta $L_1$ and 2*Delta $L_1$ arise after traversing the second double-mode fiber (in the case of reflection operation, in both directions) between the light waves of the $LP_{01}$ mode on the one hand and the waves of the $LP_{11}$ mode on the other hand. Within the individual modes, there are path differences of Delta $L_1$. Mode components with the path difference zero interfere with one another, while the remaining components deliver a constant intensity background. In this configuration, the difference of the path differences (Delta $L_1$ − Delta $L_2$) which the modes in these fibers accumulate is also equal to zero; in this case, the interference contrast V (Delta $L_1$ − Delta $L_2$) reaches its absolute maximum. The progression of the function V in dependence upon the path difference is further explained hereinbelow.

In principle, the two double-mode fibers could also exhibit differing fiber parameters. Thus, by way of example, the effective length of the sensor fiber and of the reference fiber could be selected to differ from one another in such a manner that the interference contrast only assumes a relative maximum of the function V (Delta $L_1$ − Delta $L_2$). However, in the present connection this would rather have a disadvantageous effect, on account of the value of V (Delta $L_1$ − Delta $L_2$), which value would then be smaller and also dependent upon the laser power.

The following advantages in particular arise from the reflection configuration selected according to the present invention with respect to the first double-mode fiber:

only a single monomode fiber is required for the transmission of the light between the light source and the measuring means on the one hand and the first double-mode fiber or sensor fiber;

as the light must pass through the sensor fiber twice, the phase modulation caused by the piezoelectric sensor element and thus also the sensitivity of measurement of the arrangement are doubled.

At this point, it should be pointed out that such a system, which is designated as a tandem interferometer, is already known from the prior art, in principle, for conventional interferometers (Michelson) (see, for example, A. S. Gerges et al., Appl. Optics Vol. 29, No. 30, pp. 4473–4480 (1990)).

Preferred embodiments of the invention are evident from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
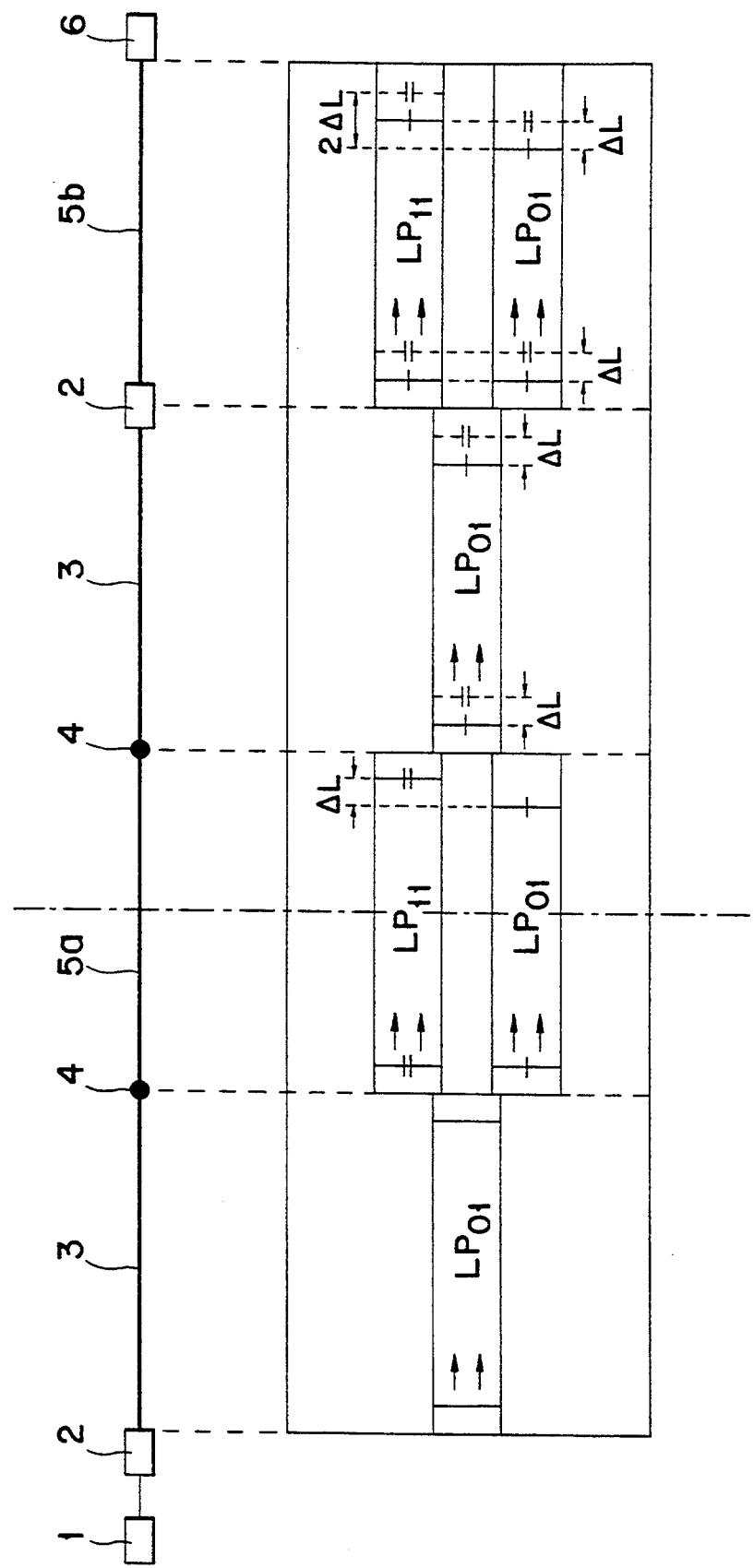
FIG. 1 shows the basic diagram of a tandem interferometer with two double-mode fibers according to the invention.

Referring now to the drawings, wherein like reference numerals designate identical or corresponding parts throughout the several views, the basic structure as well as the function of a sensor according to the invention and the propagation of a wave front of an individual, arbitrarily selected wave train are in the first instance explained with reference to FIG. 1. The light from a light source 1, a multimode laser diode, is coupled in via a fiber coupler or a beam splitter 2 into a (polarization - conserving) monomode fiber 3. It propagates therein in the fundamental mode $LP_{01}$. The wave front under consideration excites in a first double-mode fiber 5a connected by a splice 4 to the monomode fiber 3 two new wave fronts, which propagate in the $LP_{01}$ mode and in the even $LP_{11}$ mode. The first double-mode fiber 5a exhibits a mirrored end surface at its end opposite to the splice 4. The two modes are reflected at this end surface. The position of the mirrored end surface is diagrammatically identified in FIG. 1 by a dashed and dotted line. Accordingly, FIG. 1 is to be understood to the effect that the wave fronts on the far side, i.e. to the right of the dashed and dotted line, actually run back again in the reverse direction.

Both fronts are still in phase at the start of the first double-mode fiber 5a, since they are generated from a common starting front. The coupling to the first double-mode fiber 5a in the aforementioned splice 4 preferably takes place so that the intensities of the $LP_{01}$ mode and the $LP_{11}$ mode are approximately equal.

Since the effective refractive indices $n(LP_{01})$ and $n(LP_{11})$ are different for the two modes, after traversing the first double-mode fiber 5a in both directions, i.e. from the splice 4 to the mirrored end and back again, there has accumulated between the two fronts an optical path difference $$Delta\ L = Delta\ L_1 = l(n(LP_{01}) - n(LP_{11})) \quad (4)$$

Here, l designates the effective length, i.e. twice the geometric length of the first double-mode fiber 5a. This is selected in such a manner that after traversing the effective length of the first double-mode fiber 5a, no interference effects occur between the two reflected wave fronts.

The two reflected wave fronts excite in the monomode fiber 3 two new fronts, which both propagate in the $LP_{01}$ mode and travel back to the fiber coupler or beam splitter 2. The path difference Delta L between the two fronts remains conserved in the monomode fiber 3. In the splice 4, the $LP_{01}$ mode and the $LP_{11}$ mode are coupled in, approximately in equal proportions, into the monomode fiber 3.

By means of the fiber coupler or beam splitter 2, a part of the intensity of the aforementioned modes is coupled into a second double-mode fiber 5b. In contrast to the first double-mode fiber 5a, this second fiber is operated in transmission configuration. Illustrative embodiments in which the second double-mode fiber 5b is also operated in reflection configuration are further explained hereinbelow. In the second double-mode fiber 5b, the two modes respectively excite two new fronts, a respective one of which propagates in the $LP_{01}$ mode and one in the $LP_{11}$ mode. On the other hand, the $LP_{01}$ mode and the $LP_{11}$ mode have approximately equal intensities (in order to be able to follow the wave fronts better, in FIG. 1 those which originate from the $LP_{01}$ mode of the first double-mode fiber 5a are provided with a transverse stroke, and those which originate from the $LP_{11}$ mode are provided with two transverse strokes).

The path difference Delta L between the $LP_{01}$ and the $LP_{11}$ front pairs remains conserved along the second double-mode fiber 5b. Between the $LP_{01}$ front pair on the one hand and the $LP_{11}$ front pair on the other hand, there does however accumulate a phase difference Delta $L_2$. If the two double-mode fibers 5a and 5b are dimensioned equally with respect to their fiber parameters and also to their effective length (i.e. not necessarily also with respect to their geometric length), the following is applicable: Delta $L_2$=Delta $L_1$=Delta L. After traversing the effective length of the second double-mode fiber 5b, there are between the light waves of the $LP_{01}$ mode on the one hand and the waves of the $LP_{11}$ mode on the other hand path differences of zero, Delta $L_1$ and 2*Delta $L_1$. Within the individual modes, there are waves having the path difference Delta $L_1$. Mode components having the path difference zero interfere with one another, while the remaining components deliver a constant intensity background. The interference is evaluated in a detection unit 6.

Figure 2:
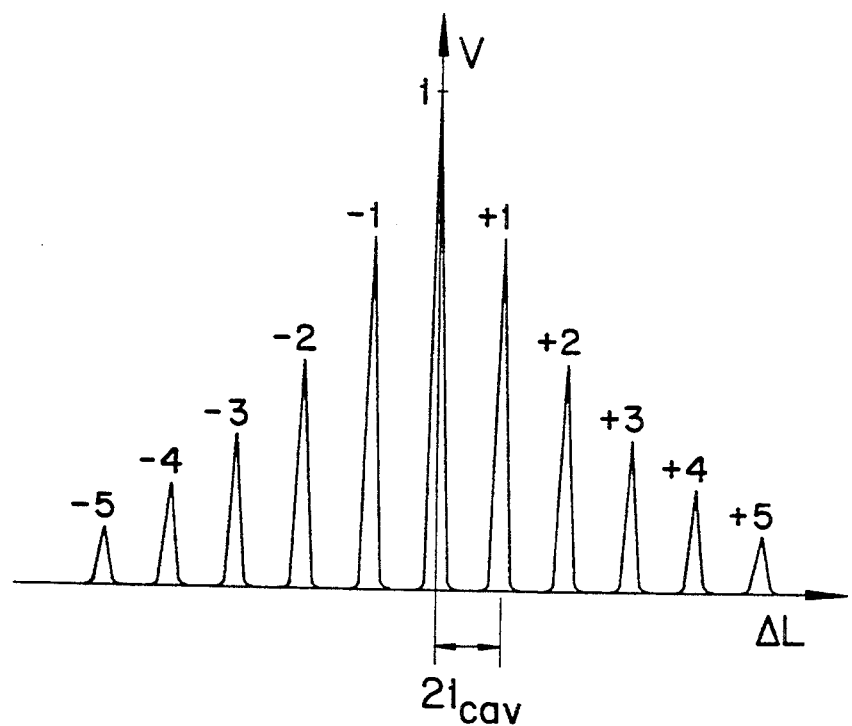
FIG. 2 shows the interference contrast V for a Michelson interferometer illuminated with a multimode laser diode, as a function of the path difference Delta L.

To provide a further understanding of the tandem double-mode fiber interferometer according to the invention, in the first instance an individual Michelson interferometer with a multimode laser diode as light source is considered, as has been described in the already cited article by A. S. Gerges et al. If the interference contrast V is plotted as a function of the optical path length difference Delta L between the two interferometer branches, then the result is a series of equidistant peaks of increasing order ±1, ±2, ±3, etc., which are situated symmetrically with respect to the peak at Delta L=0 (FIG. 2). In this case, the interference contrast V is defined as $$V = \frac{I_{max} - I_{min}}{I_{max} + I_{min}}, \quad (5)$$

where $I_{max}$ and $I_{min}$ are the intensities of the maxima and minima of the interference fringe pattern. The position of the peaks is given by $$Delta\ L = 2*p*l_{cav}\ p=0, \pm 1, \pm 2, \quad (6)$$

with the order number p and the optical length $l_{cav}$ of the laser resonator.

Between the peaks, V is very small, so that here almost no interference occurs. For equal amplitudes of the interfering waves, V (Delta L=0)=1. With increasing order number p, the height K of the peaks falls off monotonically, in accordance with the relation K (Delta L)=exp(−Delta L/$L_{cm}$); in this case, $L_{cm}$ is the coherence length corresponding to the spectral laser mode width. Thus, K tends towards zero for |Delta L| >> $L_{cm}$. In this case, it is assumed that the laser modes can be described by a Lorentz function.

In the case of the double-mode fiber interferometer, the place of the branches of the Michelson interferometer is occupied by the $LP_{01}$ mode and the $LP_{11}$ mode. With increasing effective fiber length l, the path difference Delta L=l(n($LP_{01}$)−n($LP_{11}$)) between the modes increases linearly with L. The interference contrast V (l) as a function of the effective fiber length then passes through the same series of peaks as in the case of the Michelson interferometer. The maxima are situated at effective fiber lengths $$l_p = 2*p*l_{cav}/(n(LP_{01})-n(LP_{11})). \quad (7)$$

Consequently, the fiber length difference between adjacent peaks is $$Delta\ l = 2*l_{cav}/Delta\ n_{eff} \quad (8)$$

with Delta $n_{eff}$=n($LP_{01}$)−n($LP_{11}$).

In order that no interference effects should occur at the end of the effective length of the first double-mode fiber 5a (i.e. at its geometric start), (these would result in undesired intensity fluctuations), either the path difference Delta L which is dependent upon the effective fiber length must be very much greater than $L_{cm}$, or l must be situated at a minimum between two peaks of the function V (l).

The light intensity at the output of the tandem double-mode fiber interferometer is given by (similarly to equation (7) in the article by A. S. Gerges et al.):

$$I = I_0(1 + V(Delta\ L_1)\cos(\phi_1) + V(Delta\ L_2)\cos(\phi_2) + \quad (9)$$

$$(1/2)V(Delta\ L_1 + Delta\ L_2)\cos(\phi_1 + \phi_2) +$$

$$(1/2)V(Delta\ L_1 - Delta\ L_2)\cos(\phi_1 - \phi_2))$$

$\phi_1$ and $\phi_2$ are the phase differences corresponding to the path differences Delta $L_1$ and Delta $L_2$:

$$\phi_1 = \frac{2*pi*f_0}{c}\ Delta\ L_1 \quad (10)$$

and $$\phi_2 = \frac{2*pi*f_0}{c}\ Delta\ L_2. \quad (10)$$

$f_0$ is the mean frequency of the laser diode, and c is the velocity of light. $I_0$ is proportional to the optical power of the laser diode. Delta $L_1$ and Delta $L_2$ are given by $$Delta\ L_1 = l_1*Delta\ n^{(1)}_{eff} \quad (12)$$

$$Delta\ L_2 = l_2*Delta\ n^{(2)}_{eff} \quad (13)$$

$l_1$ and $l_2$ are the effective lengths of the two double-mode fibers 5a and 5b; in this case, the effective length $l_2$ of the second double-mode fiber 4b in the Example of FIG. 1 directly corresponds to its actual, i.e. its geometric, length; Delta $n^{(1)}_{eff}$ and Delta $n^{(2)}_{eff}$ are the differences of the effective refractive indices of the modes in the two fibers.

As has already been mentioned, Delta $n^{(1)}_{eff}$=Delta $n^{(2)}_{eff}$=Delta $n_{eff}$, $l_1$=$l_2$ and consequently Delta $L_1$=Delta $L_2$. For a given type of fiber, l is then selected so that $$V(Delta\ L_1) = V(Delta\ L_2) \sim 0 \quad (14)$$

and that furthermore $$V(Delta\ L_1 + Delta\ L_2) = \sim 0 \quad (15)$$

In these circumstances, equation (9) reads as follows:

$$I = I_0(1 + (\tfrac{1}{2})V(Delta\ L_1 - Delta\ L_2)\cos z) \quad (16)$$

where z=2*pi*$f_0$(1/c)(Delta $L_1$−Delta $L_2$).

Figure 3A:
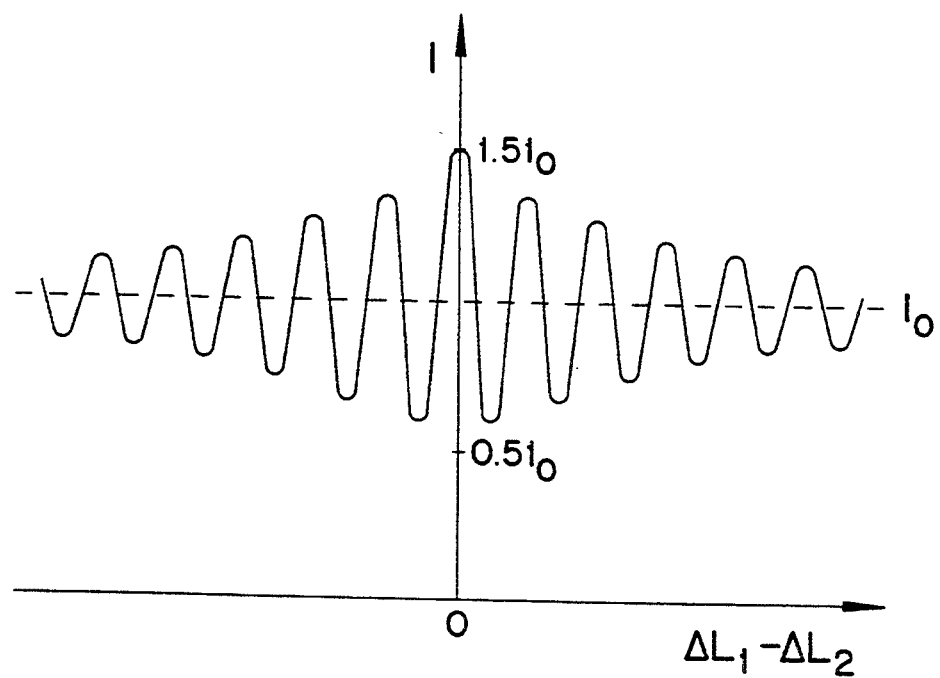
FIG. 3A shows the intensity I at the output of a tandem interferometer for the zero-order interference packet as a function of the difference in the path difference (Delta $L_1$ − Delta $L_2$)
Figure 3B:
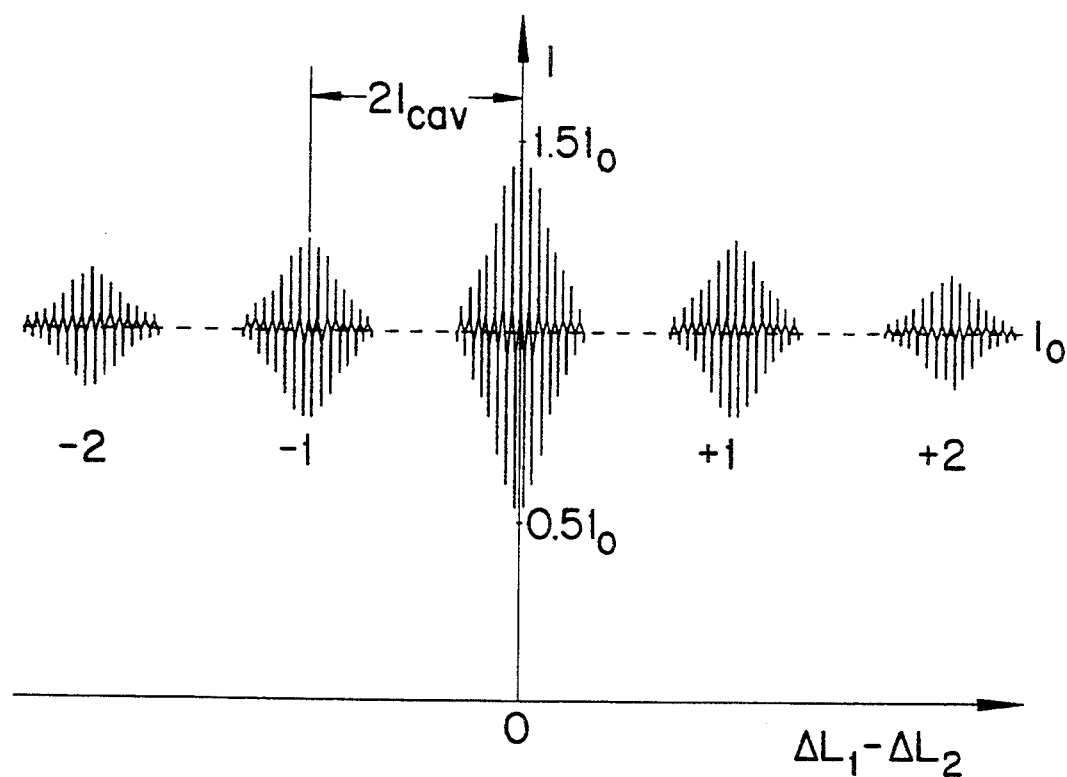
FIG. 3B shows the representation corresponding to 3A for "interference packets" of orders up to ±2.

Accordingly, the tandem double-mode fiber interferometer behaves as a single interferometer with the path difference Delta L=Delta $L_1$−Delta $L_2$, with the difference that the interference contrast is reduced by a factor of 2. The intensity I according to equation (16) is diagrammatically represented in FIGS. 3A and 3B. FIG. 3A shows the direct region about Delta $L_1$−Delta $L_2$=0 (order p=0; |Delta $L_1$−Delta $L_2$| ≦ a few 100 μm). FIG. 3B represents a larger section from the range of values of Delta $L_1$−Delta $L_2$, with "interference packets" of higher order (|p| ≦0).

For comparison purposes, a few numerical values for the tandem double-mode fiber interferometer are contrasted with the Michelson interferometer hereinbelow:

Michelson interferometer (in air):

The half-value width of the peaks in the function V (Delta L) is in the order of magnitude of 200 μm in air for many commercial multimode laser diodes. The optical length $l_{cav}$ of the laser resonator is approximately 1 mm. The spacing of two maxima is accordingly approximately 2 mm. The height K of the maxima usually falls within the first 10 orders ($|p| \leq 10$) to values of a few percent. The interference contrast, e.g. at the minimum between the maxima of seventh and eighth order of the function V, is, for a series of laser diodes for laser powers in the region of the nominal power, in the order of magnitude of 0.001 or smaller.

TANDEM DOUBLE-MODE FIBER INTERFEROMETER

The difference Delta $n_{eff} = n(LP_{01}) - n(LP_{11})$ of the effective refractive indices is greatly dependent upon the type of fiber. For a double-mode fiber for a wavelength lambda of 780 nm, it may roughly be in the range between 0.001 and 0.015.

For a fiber with, for example, Delta $n_{eff} = 0.01$, the following parameters emerge: the half-value width of the peaks of the function V(l) corresponds to a fiber length difference in the order of magnitude of (200 μm)/Delta $n_{eff} = 2$ cm. In order that the total path difference Delta $L_1$ − Delta $L_2$ of the tandem interferometer should still definitely be situated within the zero-order (p=0) "interference packet", accordingly the effective lengths of the two double-mode fibers 5a and 5b should be in precise agreement with one another to an accuracy of a few millimeters. In practice, such tolerances can be maintained without any problem.

The fiber length difference between two maxima of V(l) is (2 mm)/Delta $n_{eff} = 20$ cm. The tenth order maximum accordingly occurs at an effective fiber length of 2 m. In consequence of the relatively large spacing of two maxima of V(l), the fiber lengths can easily be set so that the conditions according to equation (14) and (15) are fulfilled.

Hereinbelow, with reference to FIGS. 5 to 11, a total of seven different embodiments of the structure of a sensor for the electric field and voltage measurement according to the invention are presented. In this case, identical or functionally equivalent elements in the various embodiments are provided in each instance with the same reference symbol.

Figure 5:
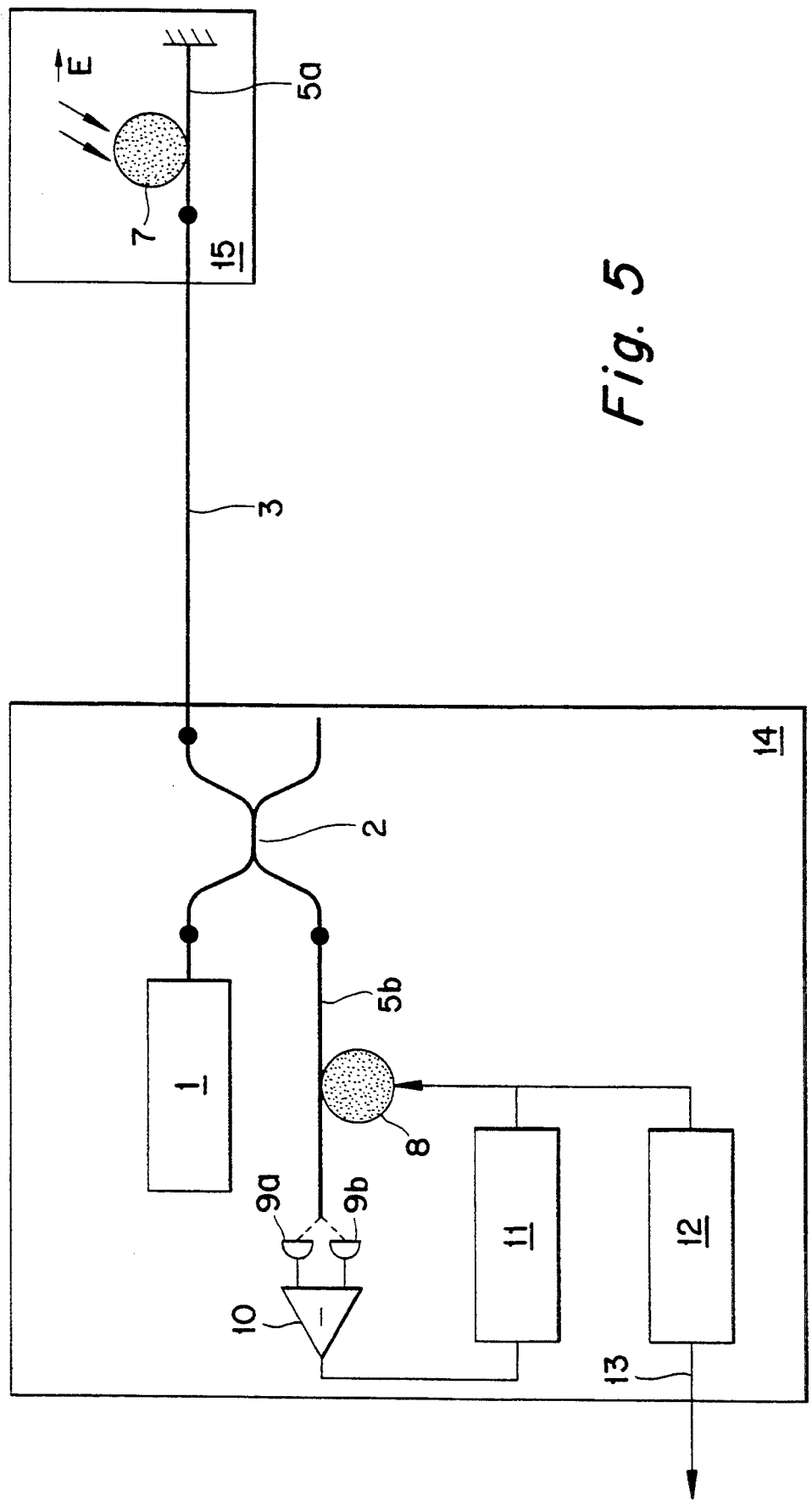
FIGS. 5–11 show the diagrammatic structure of various embodiments of the sensor according to the invention.

In the first instance, reference is made to FIG. 5. In this case, a light source is again designated by 1, a fiber coupler by 2, a monomode fiber by 3 and two double-mode fibers by 5a and 5b, respectively. In an alternating electric field E, a piezoelectric sensor element 7, (e.g. a quartz element) modulates the length of the first double-mode fiber 5a, serving as sensor fiber, and thus also the phase difference between the two modes excited in this fiber. The sensor fiber 5a is mirrored at one of its ends, i.e. the right-hand end, and is accordingly operated in reflection configuration. The second double-mode fiber 5b, serving as reference fiber, is on the other hand operated in transmission. It is twice as long as the sensor fiber 5a. The phase difference of the waves interfering at the end of the reference fiber 5b is given by:

$$\phi(t) = A^*\sin(\omega^*t) + \phi^0{}_1(t) - \phi^0{}_2(t). \tag{17}$$

$\phi^0{}_1(t)$ and $\phi^0{}_2(t)$ are the phase differences between the modes of the two double-mode fibers 5a and 5b, when no modulation takes place. $\phi^0{}_1(t)$ and $\phi^0{}_2(t)$ can also change with time, for example in consequence of temperature fluctuations (temperature-dependent fiber lengths). The temperature fluctuations of the path differences are however very much smaller than the width of the peaks of the function V (Delta L), so that the interference contrast is virtually not altered thereby. Equation (16) then reads as follows:

$$I = I_0(1 + (\tfrac{1}{2})V\cos(A^*\sin(\omega^*t) + \phi^0{}_1(t) - \phi^0{}_2(t)) \tag{18}$$

Figure 4:
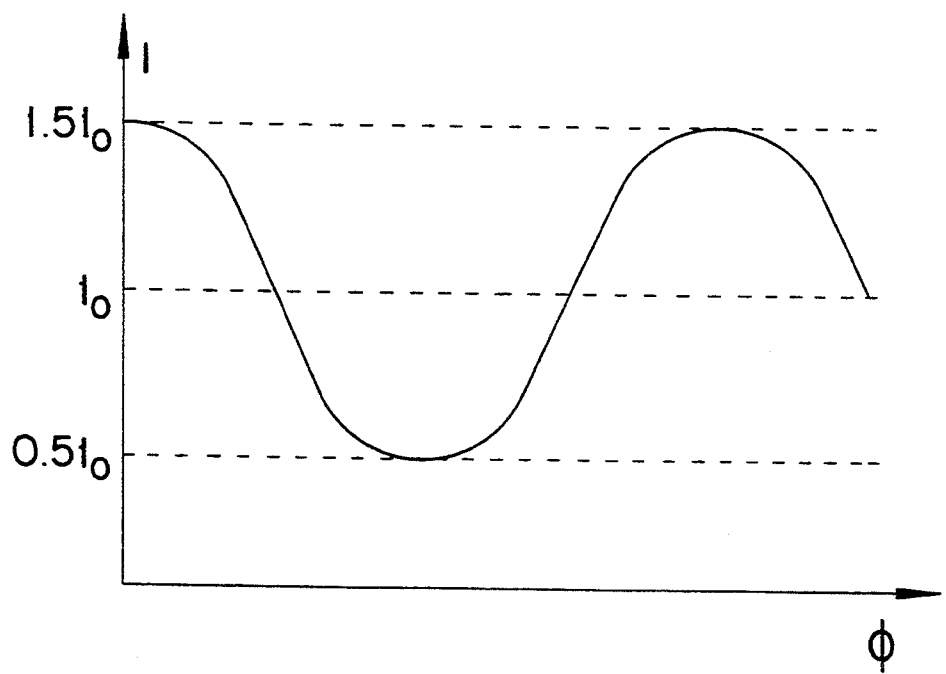
FIG. 4 shows the intensity I for V=1 as a function of the phase.

The intensity I is shown as a function of the phase $\phi$ in FIG. 4 for V=1. For the signal detection, in the illustrative embodiment of FIG. 5 the homodyne detection method with active phase compensation is employed (see the initially cited EP-A1-0,433,824). This method has the advantage of a high measurement accuracy with, at the same time, a simple electronic system.

The difference $\phi^0{}_1(t) - \phi^0{}_2(t)$ is regulated to pi/2 modulo 2*pi, and the term $A^*\sin(\omega^*t)$ is compensated by an additional, counter-phase modulation. To this end, a piezoelectric modulator 8 is provided, which is controlled by a quadrature controller 11. The quadrature controller 11 receives its input signal from two detectors 9a and 9b disposed at the output end of the reference fiber 5b. These convert the two counter-phase interference signals, which arise from the interference of the two modes, into electrical signals, from which the difference is formed by means of a downstream subtractor 10. As a result of the difference formation, the DC offsets of the detector output voltages are eliminated. From the control signal of the quadrature controller 11, the measurement signal is extracted by means of a high-pass filter 12 and is made available at a signal output 13.

To avoid misunderstandings, it should be noted that in the case of a fiber mode Zehnder interferometer as well, a modulator is provided, which acts on a (monomode) reference fiber. Here, the $LP_{11}$ mode of the sensor fiber would correspond to this.

As the measuring means according to the present invention include a second double-mode fiber 5b and the modulator 8 acts on this second double-mode fiber, the sensor fiber 5a can be restricted to the immediate region of the sensor element 7 and does not need to bridge the distance between sensor element 7 and evaluating unit 14. The first sensor fiber 5a can advantageously thus form, together with the sensor element 7, a compact and simply constructed sensor head 15, which is connected only by the insensitive monomode fiber 3 to the evaluating unit 14, in which the reference fiber 5b, the modulator 8 together with drive as well as also the light source 1 and the fiber coupler 2 are situated. The terms $A^*\sin(\omega^*t)$ and $\phi^0{}_1(t) - \phi^0{}_2(t)$ can moreover also—as already described previously—be compensated by two separate modulators in place of modulator 8.

The two (polarization-conserving) double-mode fibers 5a, 5b have preferably a core with elliptical cross section. The fiber parameters can then be selected so that for the wavelength of the laser diode only the $LP_{01}$ mode and the even $LP_{11}$ mode are capable of propagation (see the initially cited article by B. Y. Kim et al.). In fibers with a round core, the odd $LP_{11}$ mode would also be capable of propagation at the same time as the even.

The monomode fiber 3 is preferably designed to conserve polarization. However, it is also possible to use a conventional monomode fiber. The polarization would then have to be actively controlled, as has been described in T. Pikaar et al., J. Lightw. Tech. 7, 1982-1987 (1989).

Figure 6:
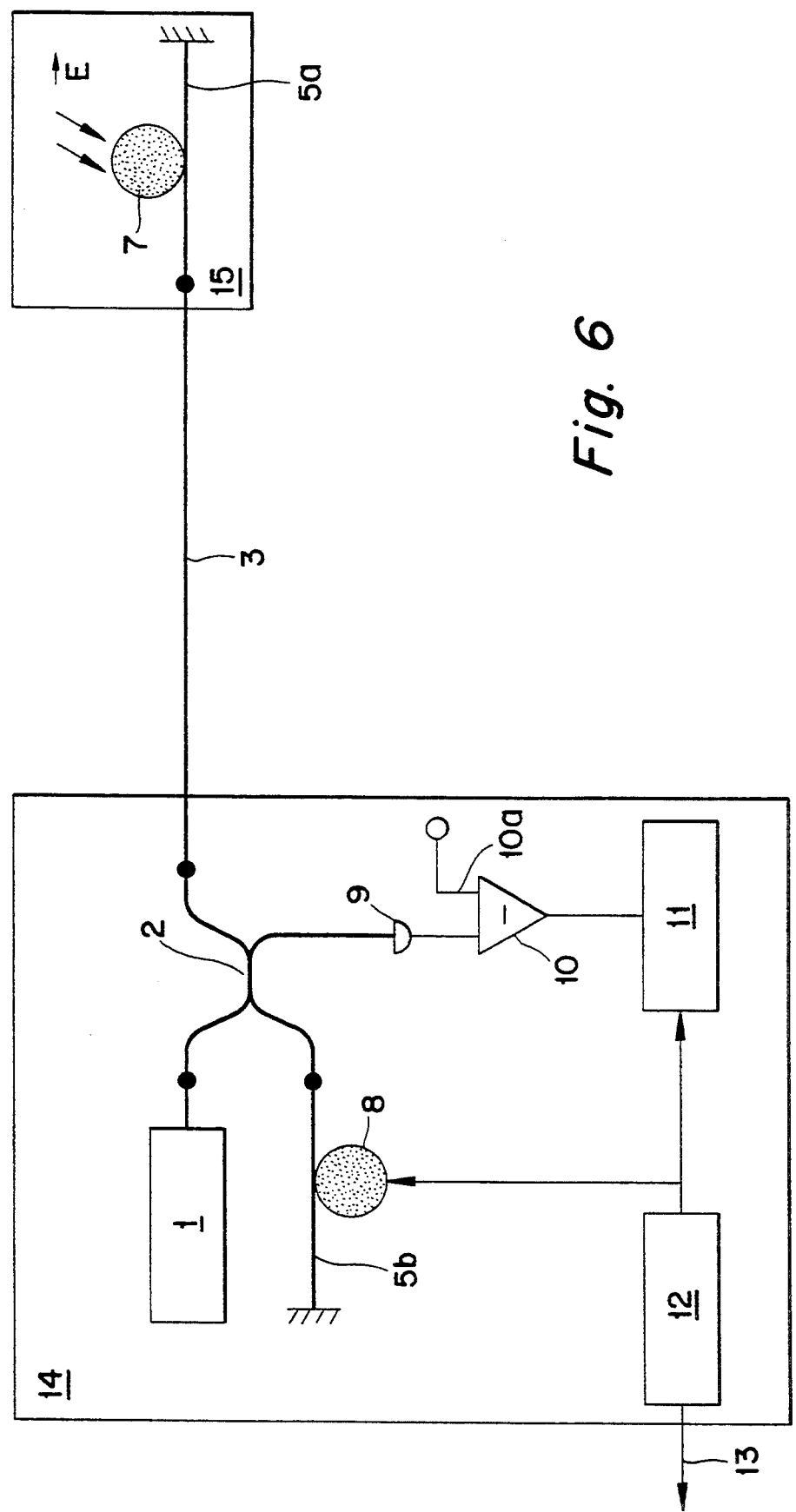

In the embodiment according to FIG. 6, the reference fiber 5b is operated in reflection configuration. As in FIG. 5, a homodyne detection system and a fiber coupler 2 are employed. If the reference fiber is operated in reflection and to split up the light path a fiber coupler (monomode) is employed, in principle only one of the two counter-phase interference signals is available at the detector output of the fiber coupler. Accordingly, in FIG. 6 only one detector 9 is also provided. Thus, an additional DC offset voltage must be applied to the second input 10a of the subtractor 10. This voltage is selected so that it compensates both the DC offset of the interference modulation $$I = I_0(1 + \tfrac{1}{2}V \cos \phi(t)) \tag{19}$$

and also the additional offset which is generated by the light of the light source 1, which light passes on a direct path from the light source 1 via the fiber coupler 2 to the detector 9.

Figure 7:
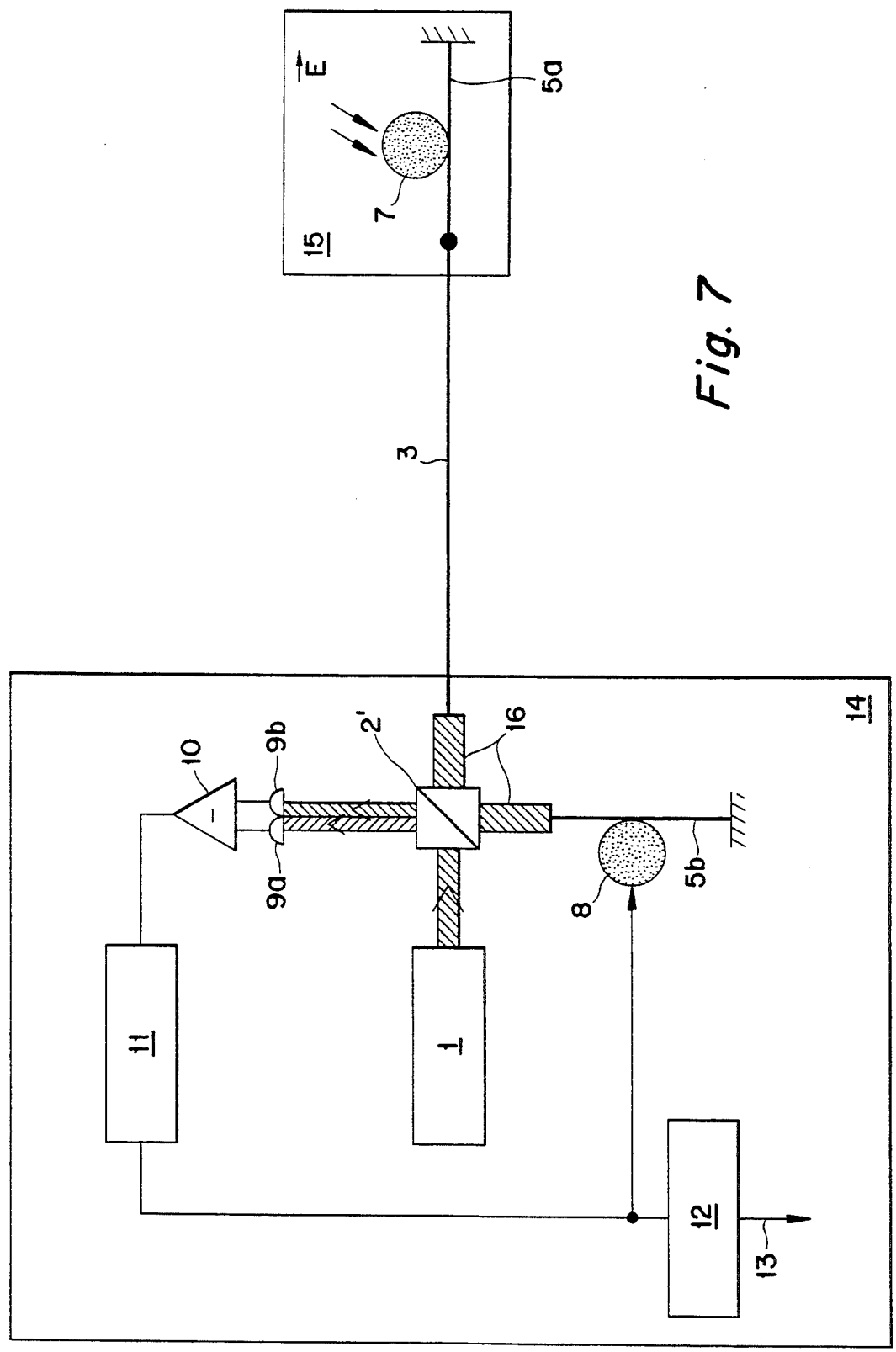

In the embodiment according to FIG. 7, the reference fiber is likewise operated in reflection configuration. In place of a fiber coupler, use is however made here of a beam splitter 2'. So called Selfoc lenses 16 (0.25 - pitch lenses) are provided for coupling in and coupling out the beam. The light beams between light source 1 and beam splitter 2' on the one hand and between the latter and the detectors 9a, 9b on the other hand are collimated. In the embodiment according to FIG. 7, the two counter-phase interference signals are available, so that the DC offsets of the detector output voltages can be eliminated by formation of their difference.

Figure 8:
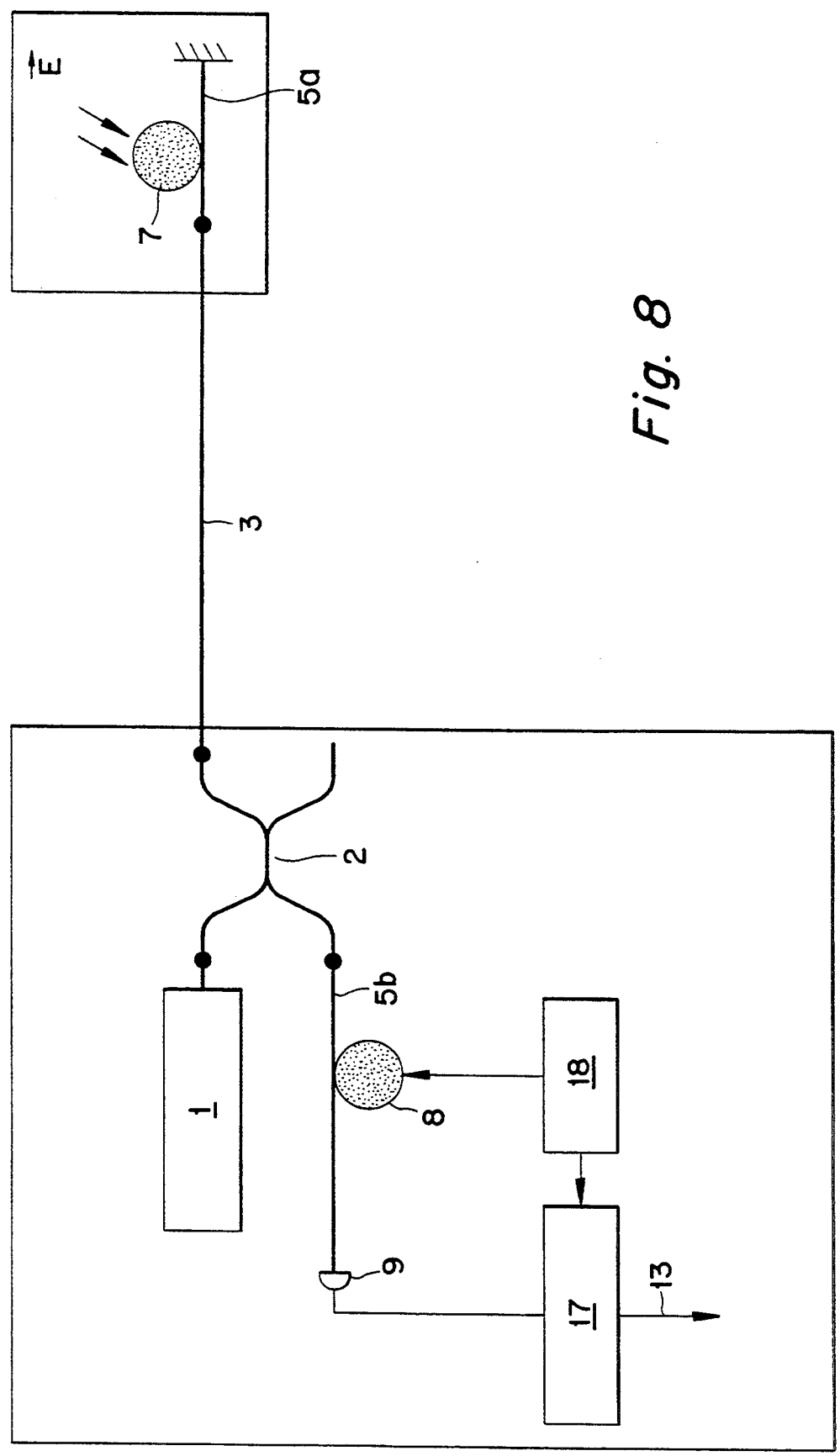

FIG. 8 shows an embodiment with the reference fiber 5b again in transmission configuration. Again, a fiber coupler 2 is also used to split up the light path. In this case, the signal demodulation takes place by means of the initially mentioned homodyne method, in which a carrier phase modulation is generated, or by means of the likewise initially already mentioned synthetic heterodyne method. The block diagrams are identical for both methods; they differ only in the type of demodulating electronic system, which is designated overall by 17. The modulator 8 is driven by an oscillator 18 with an appropriately selected amplitude and frequency, the oscillator signal also being passed to the demodulating electronic system 17. The demodulating electronic system delivers an output signal proportional to the phase modulation $A*\sin(\omega*t)$ to be measured. For both demodulation methods, it is further sufficient to evaluate only one of the two counter-phase interference signals. Accordingly, only one detector 9 is also provided.

Figure 9:
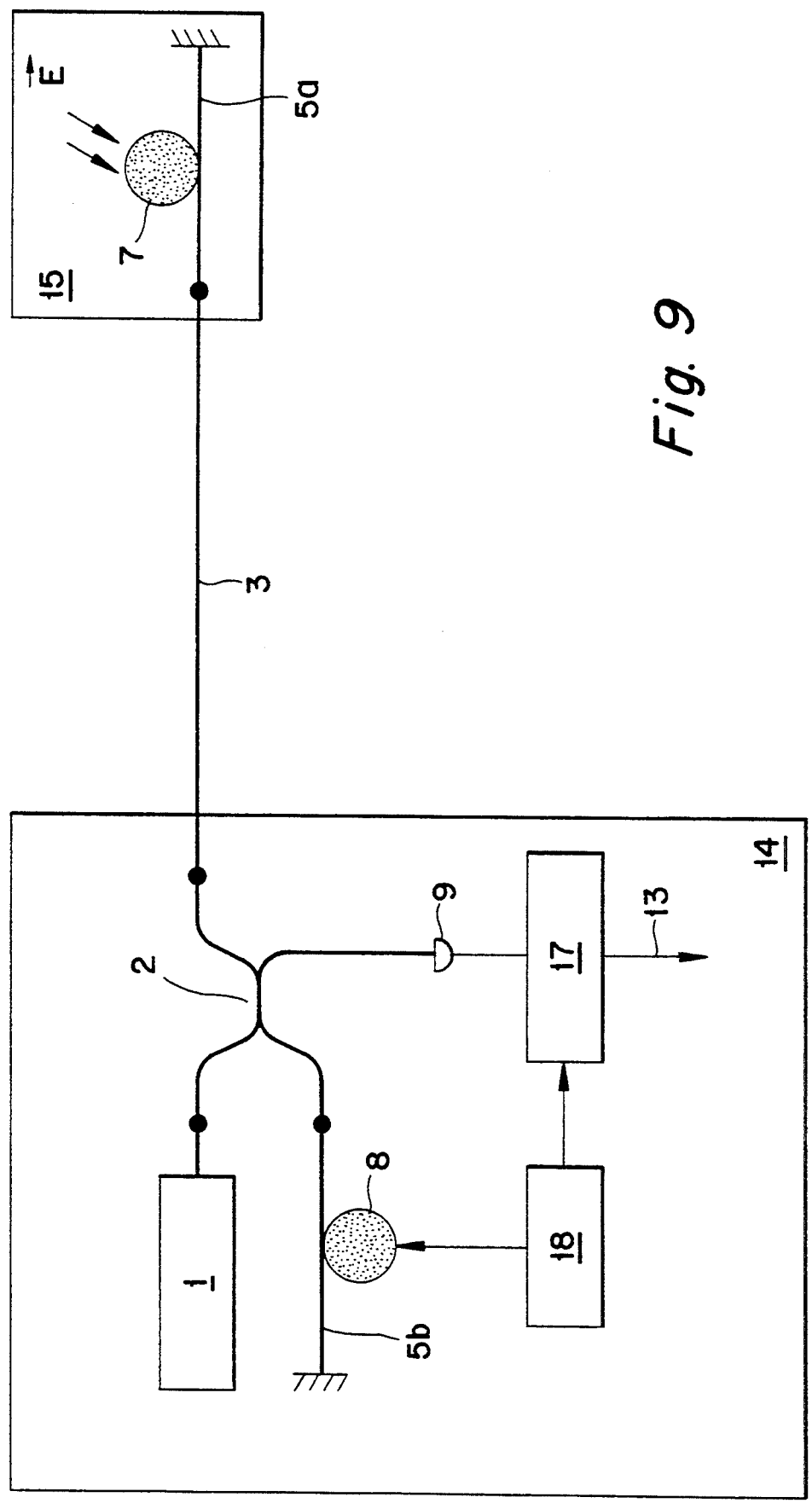

The embodiment of FIG. 9 corresponds to that of FIG. 8 apart from the difference that for the reference fiber 5b a reflection geometry is again selected. The fact that it is sufficient, for the demodulation method mentioned in conjunction with FIG. 8, to evaluate only one of the two counter-phase interference signals is here of advantage in so far as when using a fiber coupler (monomode) and when operating the reference fiber in reflection geometry in any event only one of the two counter-phase interference signals is available at the detector output of the fiber coupler. Reference has already been made to this in connection with FIG. 6.

Figure 10:
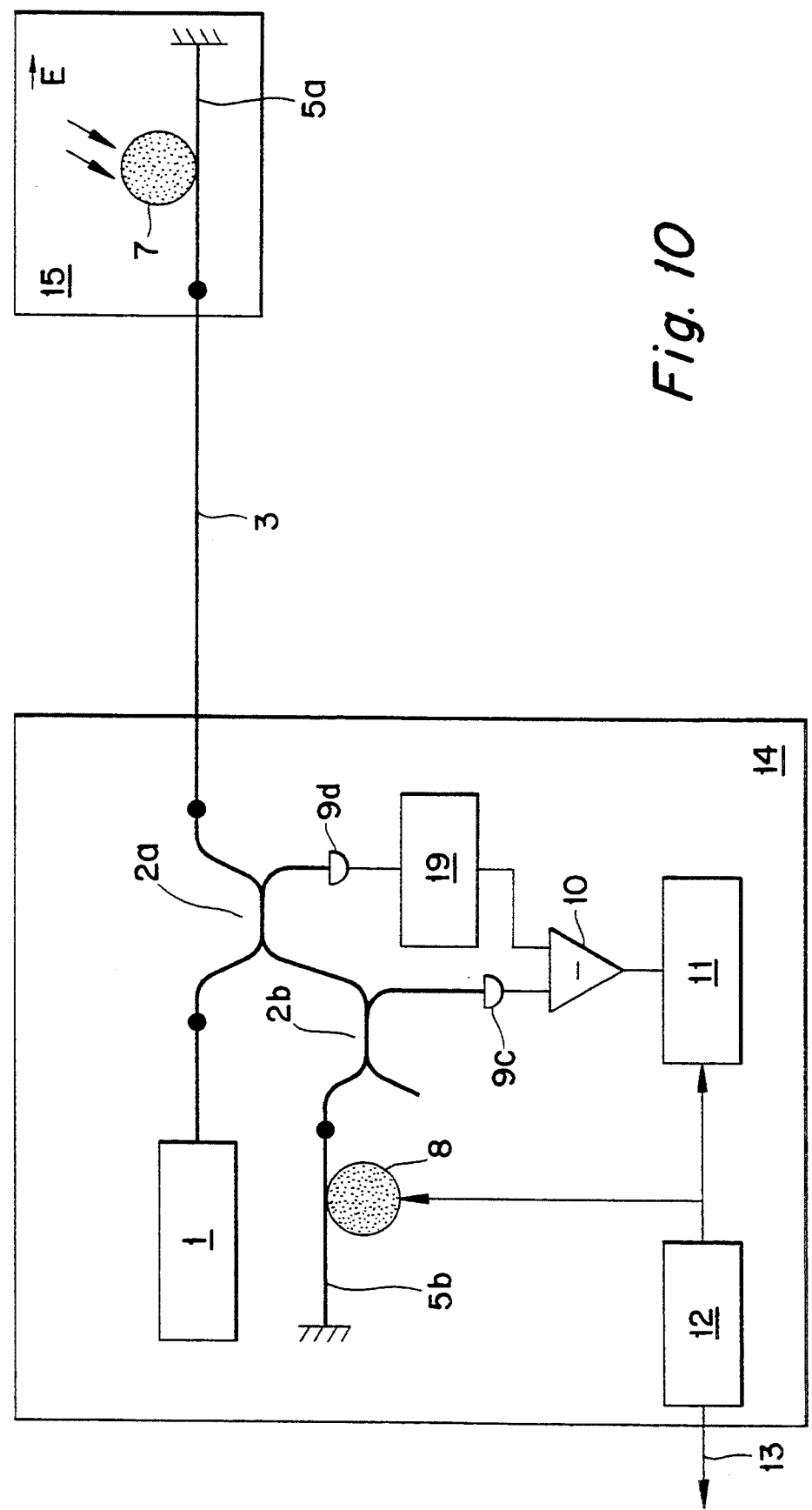

FIG. 10 shows a modification of the configuration of FIG. 6. In place of a fiber coupler 2, in this case two fiber couplers 2a, 2b are employed. At the detector output of each fiber coupler, a respective detector 9c or 9d is provided. As a result of the use of the two fiber couplers, it is possible to avoid a situation in which light from the light source 1 passes on a direct path to the detector 9c and causes the DC offset mentioned in connection with FIG. 6. The result is an improved signal/noise ratio. Moreover, a further output is available, at which, by means of the second detector 9d, the direct light from the light source 1 can be measured. From the corresponding measurement signal, in FIG. 10 the voltage for the second input 10a of the subtractor 10 is derived via a unit 19. This voltage serves to compensate the DC offset of the interference modulation, which offset is proportional to the light intensity given off by the light source 1. Any possible fluctuations of the light intensity and of this offset can be inherently compensated thereby, In FIG. 11, a modification of the configuration of FIG. 9 is represented, in which, likewise, two fiber couplers are employed.

Figure 11:
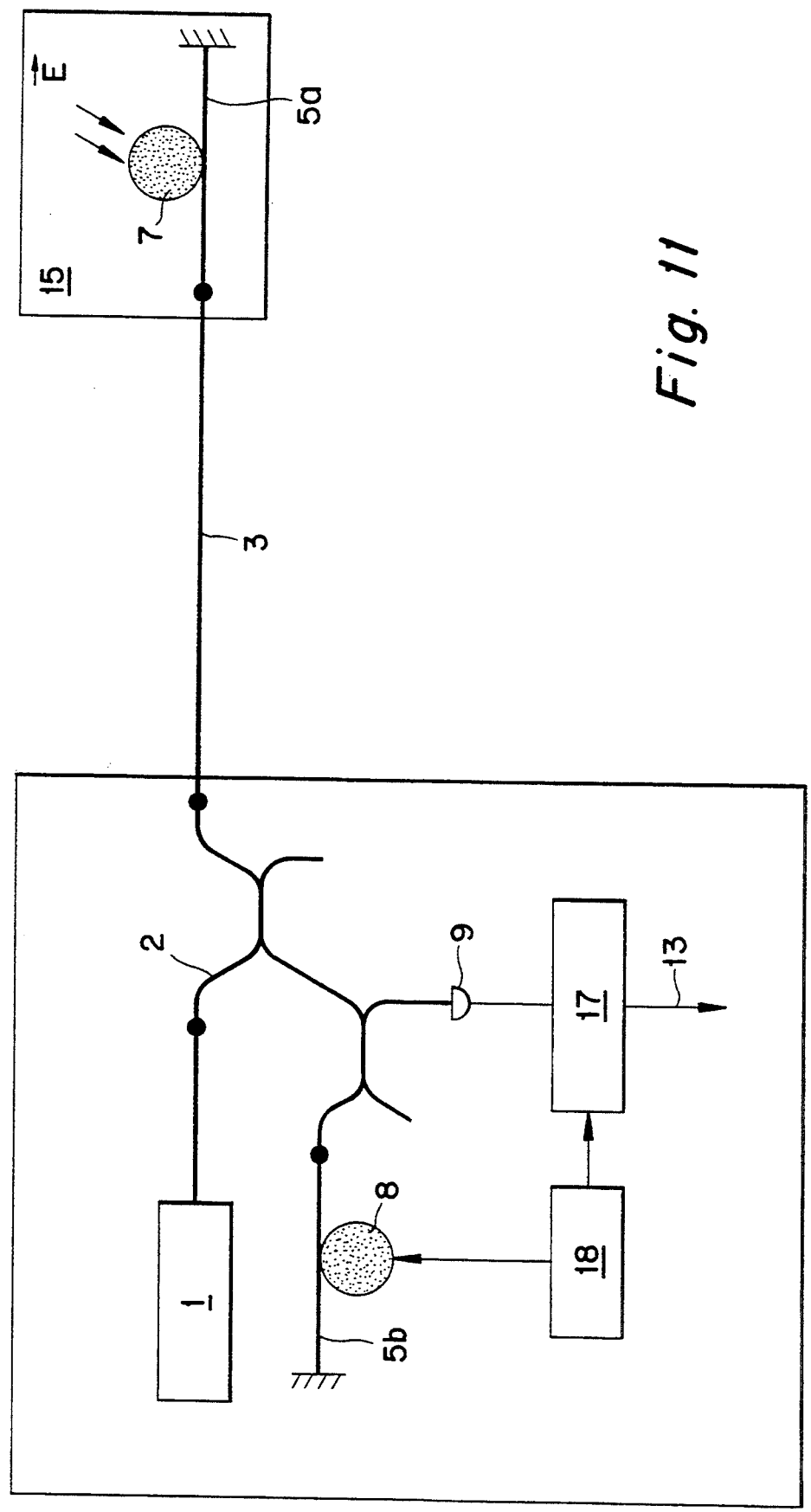

In a similar manner to the embodiments according to FIGS. 10 and 11, in the embodiment shown in FIG. 7 it is possible to use two beam splitters, in order in this case as well to prevent a situation in which light from the light source 1 directly reaches the detectors 9a, 9b.

In the above-described illustrative embodiments, in all cases it was assumed that the two double-mode fibers 5a, 5b are in conformity with respect to their fiber parameters. On the other hand, it was already mentioned hereinabove that the two double-mode fibers could in principle also exhibit differing fiber parameters. Besides differing effective fiber lengths, the two fibers could for example also especially exhibit differing values of Delta $n^{(1)}_{eff}$ and Delta $n^{(2)}_{eff}$. The effective fiber lengths $l_1$ and $l_2$ would then have to be matched so that with $$Delta\ L_1 = l_1 * Delta\ n^{(1)}_{eff}$$

$$Delta\ L_2 = l_2 * Delta\ n^{(2)}_{eff}$$

the following is also applicable:

$$Delta\ L_1 = Delta\ L_2 = Delta\ L$$

The path differences Delta $L_1$ and Delta $L_2$ are in this case naturally, just as previously, to be selected so that the interference contrast (V) is in each instance approximately equal to zero for these path differences (Delta $L_1$, Delta $L_2$) and for the sum of these path differences (Delta $L_1$ + Delta $L_2$), and adopts an absolute or relative maximum for the difference of these path differences (Delta $L_1$ − Delta $L_2$).

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A fiber-optic sensor for alternating electric fields and voltages, comprising:
   (a) a light source;

(b) a piezoelectric sensor element;
(c) a first double-mode fiber having an input end and another end, in which fiber an $LP_{01}$ fundamental mode and an even $LP_{11}$ mode can propagate, and which fiber is fixed at least partially to the sensor element such that a dimensional alteration of the sensor element in an electric field leads to a length alteration in the fiber;
(d) means for measuring the field-dependent length alteration of the fiber; wherein
(e) the light source is a multimode laser diode;
(f) the measuring means comprises a second double-mode fiber;
(g) parameters of the first and second double-mode fibers and thus relative path differences, which accumulate in the individual double-mode fibers, are tuned to coherence properties of the light source so that interference contrast for the said path differences and for the sum of these path differences is in each instance approximately equal to zero and for the difference of the said path differences adopts an absolute or relative maximum;
(h) said another end of the first double-mode fiber is mirrored;
(i) a monomode fiber is provided for transmission of light between the light source and the measuring means on the one hand and the input end of the first double-mode fiber on the other hand; and
(j) means are provided for coupling-in light from the light source into the monomode fiber and for coupling-out light reflected at said another end of the first double-mode fiber from the monomode fiber into the second double-mode fiber.

2. The fiber-optic sensor as claimed in claim 1, wherein:
(a) the double-mode fibers exhibit a core with elliptical cross section; and
(b) the monomode fiber is polarization-conserving.

3. The fiber-optic sensor as claimed in claim 2, wherein modes which can propagate in said first and second double-mode fibers are in each instance excited with approximately equal intensity.

4. The fiber-optic sensor as claimed in claim 3, wherein effective refractive index differences n ($LP_{01}$) −n($LP_{11}$) for the two modes in the first and second double-mode fibers as well as effective lengths of the two double-mode fibers are respectively equal.

5. The fiber-optic sensor as claimed in claim 1, wherein the second double-mode fiber is fixed at least partially to a piezoelectric modulator.

6. The fiber-optic sensor as claimed in claim 5, wherein:
(a) the second double-mode fiber is operated in transmission configuration;
(b) a fiber coupler is used;
(c) two detectors are provided for measuring an interference pattern of the modes propagating in the second double-mode fiber;
(d) output signals of the two detectors pass via a subtractor to an input of a quadrature controller;
(e) an output of the quadrature controller controls the modulator; and
(f) the output signal of the quadrature controller is passed via a high-pass filter to a signal output.

7. The fiber-optic sensor as claimed in claim 5, wherein:

(a) the second double-mode fiber is operated in reflection configuration, on account of mirroring at one end;
(b) said coupling means includes a fiber coupler;
(c) a detector is provided for measuring intensity which arises from interference of modes propagating in the second double-mode fiber;
(d) an output signal of the detector is passed via a subtractor to an input of a quadrature controller;
(e) not only the output signal of the detector but also a DC offset voltage is applied to a substractor;
(f) an output of the quadrature controller controls the modulator; and
(g) the output signal of the quadrature controller is passed via a high-pass filter to a signal output.

8. The fiber-optic sensor as claimed in claim 5, wherein:
(a) the second double-mode fiber is operated in reflection configuration, on account of mirroring at one end;
(b) said coupling means includes a beam splitter;
(c) two detectors are provided for measuring interference of the modes propagating in the second double-mode fiber;
(d) output signals of the two detectors are passed via a subtractor to an input of a quadrature controller;
(e) an output of the quadrature controller controls the modulator; and
(f) the output signal of the quadrature controller is passed via a high-pass filter to a signal output.

9. The fiber-optic sensor as claimed in claim 5, wherein:
(a) the second double-mode fiber is operated in transmission configuration;
(b) said coupling means includes a fiber coupler;
(c) a detector is provided for measuring interference of the modes propagating in the second double-mode fiber;
(d) the output signal of the detector is fed to a demodulating electronic system;
(e) the modulator is driven by an oscillator
(f) an oscillator signal is also fed to the demodulating electronic system; and
(g) an output signal of the demodulating electronic system is fed to a signal output.

10. The fiber-optic sensor as claimed in claim 5, wherein:
(a) the second double-mode fiber is operated in reflection configuration, on account of mirroring at one end;
(b) said coupling means includes a fiber coupler;
(c) a detector is provided for measuring interference of the modes propagating in the second double-mode fiber;
(d) an output signal of the detector is fed to a demodulating electronic system;
(e) the modulator is driven by an oscillator;
(f) an oscillator signal is also fed to the demodulating electronic system; and
(g) an output signal of the demodulating electronic system is fed to a signal output.

11. The fiber-optic sensor as claimed in claim 5, wherein:
(a) the second double-mode fiber is operated in reflection configuration, an account of mirroring at one end;
(b) said coupling means includes two fiber couplers, a first fiber coupler being connected to the light source and the monomode fiber, and the second fiber coupler being connected to an output of the first fiber coupler and the second double-mode fiber;

(c) a first detector is provided for measuring interference of the modes propagating in the second double-mode fiber;

(d) the first detector is connected to an output of the second fiber coupler;

(e) an output signal of the first detector is passed via a subtractor to an input of a quadrature controller;

(f) an output signal of the first detector and an output signal of a second detector are applied to the subtractor;

(g) the second detector is connected to an output of the first fiber coupler;

(h) an output of the quadrature controller controls the modulator; and (i) an output signal of the quadrature controller is passed via a high-pass filter to a signal output.

12. The fiber-optic sensor as claimed in claim 5, wherein:

(a) the second double-mode fiber is operated in reflection configuration, on account of mirroring at one end;

(b) said coupling means includes two fiber couplers, a first fiber coupler being connected to the light source and the monomode fiber, and the second fiber coupler being connected to an output of the first fiber coupler as well as the second double-mode fiber;

(c) a detector is provided for measuring interference of the modes propagating in the second double-mode fiber;

(d) the detector is connected to an output of the second fiber coupler;

(e) the output signal of the detector is fed to a demodulating electronic system;

(f) the modulator is driven by an oscillator;

(g) an oscillator signal is also fed to the demodulating electronic system; and (d) an output signal of the demodulating electronic system is fed to a signal output.

13. The fiber-optic sensor as claimed in claim 5, wherein:

(a) the second double-mode fiber is operated in reflection configuration, on account of mirroring at one end;

(b) said coupling means includes two beam splitters, a first beam splitter being connected to the light source and the monomode fiber, and the second beam splitter being connected to a branch of the first beam splitter as well as the second double-mode fiber;

(c) two detectors are provided for measuring interference of the modes propagating in the second double-mode fiber;

(d) the detectors are connected to a branch of the second beam splitter;

(e) an output signal of the detectors is passed via a subtractor to an input of a quadrature controller;

(f) an output of the quadrature controller controls the modulator; and (g) the output signal of the quadrature controller is passed via a high-pass filter to a signal output.

14. The fiber-optic sensor as claimed in claim 6, wherein:

(a) the light source, the coupling means, the second double-mode fiber, the modulator, the detectors, the quadrature controller and the high pass filter are combined to form an evaluating unit;

(b) the first double-mode fiber together with the sensor element are disposed in a separate sensor head; and (c) the sensor head and the evaluating unit are connected to one another by the monomode fiber.

15. The fiber-optic sensor as claimed in claim 7, wherein:

(a) the light source, the coupling means, the second double-mode fiber, the modulator, the detector, the quadrature controller and the high pass filter are combined to form an evaluating unit;

(b) the first double-mode fiber together with the sensor element are disposed in a separate sensor head; and (c) the sensor head and evaluating unit are connected to one another by the monomode fiber.

16. The fiber-optic sensor as claimed in claim 8, wherein:

(a) the light source, the coupling means, the second double-mode fiber, the modulator, the detectors, the quadrature controller and the high pass filter are combined to form an evaluating unit;

(b) the first double-mode fiber together with the sensor element are disposed in a separate sensor head; and (c) the sensor head and evaluating unit are connected to one another by the monomode fiber.

17.
(a) the light source, the coupling means, the second double-mode fiber, the modulator, the detector, the demodulating electronic system and the oscillator are combined to form an evaluating unit;

(b) the first double-mode fiber together with the sensor element are disposed in a separate sensor head; and (c) the sensor head and evaluating unit are connected to one another by the monomode fiber.

18. The fiber-optic sensor as claimed in claim 10, wherein:

(a) the light source, the coupling means, the second double-mode fiber, the modulator, the detector, the demodulating electronic system and the oscillator are combined to form an evaluating unit;

(b) the first double-mode fiber together with the sensor element are disposed in a separate sensor head; and (c) the sensor head and evaluating unit are connected to one another by the monomode fiber.

19. The fiber-optic sensor as claimed in claim 11, wherein:

(a) the light source, the coupling means, the second double-mode fiber, the modulator, the first and second detectors, the quadrature controller and the high pass filter are combined to form an evaluating unit;

(b) the first double-mode fiber together with the sensor element are disposed in a separate sensor head; and (c) the sensor head and evaluating unit are connected to one another by the monomode fiber.

20. The fiber-optic sensor as claimed in claim 12, wherein:

(a) the light source, the coupling means, the second double-mode fiber, the modulator, the first and second detectors, the demodulating electronic system, and the oscillator are combined to form an evaluating unit;
(b) the first double-mode fiber together with the sensor element are disposed in a separate sensor head; and
(c) the sensor head and evaluating unit are connected to one another by the monomode fiber.

21. The fiber-optic sensor as claimed in claim 13, wherein (a) the light source, the coupling means, the second double-mode fiber, the modulator, the detectors, the quadrature controller and the high pass filter are combined to form an evaluating unit;
(b) the first double-mode fiber together with the sensor element are disposed in a separate sensor head; and
(c) the sensor head and evaluating unit are connected to one another by the monomode fiber.

* * * * *